(12) United States Patent
Yamashita et al.

(10) Patent No.: US 8,637,830 B2
(45) Date of Patent: Jan. 28, 2014

(54) RADIATION IMAGE CONVERSION PANEL AND METHOD FOR PRODUCING SAME

(75) Inventors: Masanori Yamashita, Hamamatsu (JP); Yutaka Kusuyama, Hamamatsu (JP); Shintaro Toyama, Hamamatsu (JP); Kazuhiro Shirakawa, Hamamatsu (JP); Munenori Shikida, Hamamatsu (JP)

(73) Assignee: Hamamatsu Photonics K.K., Hamamatsu-shi, Shizouka (JP)

( * ) Notice: Subject to any disclaimer, the term of this patent is extended or adjusted under 35 U.S.C. 154(b) by 244 days.

(21) Appl. No.: 13/255,715

(22) PCT Filed: Mar. 10, 2010

(86) PCT No.: PCT/JP2010/054016
§ 371 (c)(1),
(2), (4) Date: Oct. 10, 2011

(87) PCT Pub. No.: WO2010/104119
PCT Pub. Date: Sep. 16, 2010

(65) Prior Publication Data
US 2012/0025102 A1 Feb. 2, 2012

(30) Foreign Application Priority Data
Mar. 13, 2009 (JP) ................ P2009-060911

(51) Int. Cl.
*G01T 1/20* (2006.01)
*G21K 4/00* (2006.01)

(52) U.S. Cl.
USPC ............. 250/370.11; 250/361 R; 250/484.4

(58) Field of Classification Search
USPC .............. 250/361 R, 370.11, 484.4
See application file for complete search history.

(56) References Cited

U.S. PATENT DOCUMENTS

| | | | |
|---|---|---|---|
| 5,334,839 A | 8/1994 | Anderson et al. |
| 6,835,936 B2 | 12/2004 | Okada et al. |
| 6,870,167 B2 | 3/2005 | Iwabuchi et al. |
| 6,911,654 B2 | 6/2005 | Okada et al. |
| 6,992,296 B2 | 1/2006 | Okada et al. |
| 7,170,063 B2 | 1/2007 | Okada et al. |
| 7,199,380 B2 | 4/2007 | Isoda et al. |
| 7,425,707 B2 | 9/2008 | Okada et al. |
| 2005/0051736 A1 | 3/2005 | Isoda et al. |

FOREIGN PATENT DOCUMENTS

| | | |
|---|---|---|
| CN | 1036665 | 10/1989 |
| CN | 1372324 | 10/2002 |
| CN | 1489705 | 4/2004 |
| JP | 562-010687 | 1/1987 |
| JP | 8-508567 | 9/1996 |
| JP | 2002-236181 | 8/2002 |
| JP | 2003-50298 | 2/2003 |
| JP | 2003-75542 | 3/2003 |

(Continued)

*Primary Examiner* — Casey Bryant
(74) *Attorney, Agent, or Firm* — Drinker Biddle & Reath LLP

(57) ABSTRACT

In a radiation image conversion panel (10), a radiation conversion layer (2) for converting an incident radiation into light is formed on a substrate (1). The radiation conversion layer (2) has a reflective layer (3), on a side opposite from a light exit surface (2*a*) for emitting the light, for reflecting the light to the exit surface (2*a*) side, while the reflective layer (3) has a helical structure comprising helically stacked phosphor crystals. Thus constructed radiation image conversion panel (10) can enhance the reflectance without forming a reflective layer made of a thin metal film or the like and exhibit a reflectance higher than that in the case where the reflective layer is formed by spherical crystal particles.

15 Claims, 13 Drawing Sheets

(56) References Cited

FOREIGN PATENT DOCUMENTS

| JP | 2003-166873 | 6/2003 |
| JP | 2005-016980 | 1/2005 |
| JP | 2005-69991 | 3/2005 |
| JP | 2005-164380 | 6/2005 |
| JP | 2005-241430 | 9/2005 |
| JP | 3987469 | 7/2007 |
| JP | 2007-315866 | 12/2007 |
| JP | 2008-014892 | 1/2008 |
| JP | 2008-170374 | 7/2008 |

Fig.6

| Substrate type/pitch [μm] | | Rotational number difference | | | | | |
|---|---|---|---|---|---|---|---|
| | | 0.4 | 0.5 | 1 | 3 | 12 | 25 |
| | | 5 | 4 | 2 | 0.67 | 0.17 | 0.04 |
| a-c substrate | | 49.2% | 48.9% | 37.1% | 28.4% | 17.3% | 16.1% |
| Glass substrate | | 60.1% | 59.3% | 53.3% | 39.2% | 37.7% | 38.5% |
| Substrate A | | 64.8% | 64.2% | 60.3% | 56.1% | 57.3% | 56.9% |
| Substrate B | | 66.8% | 66.5% | 65.8% | 59.0% | 59.1% | 58.7% |

*Fig.8*
(a)
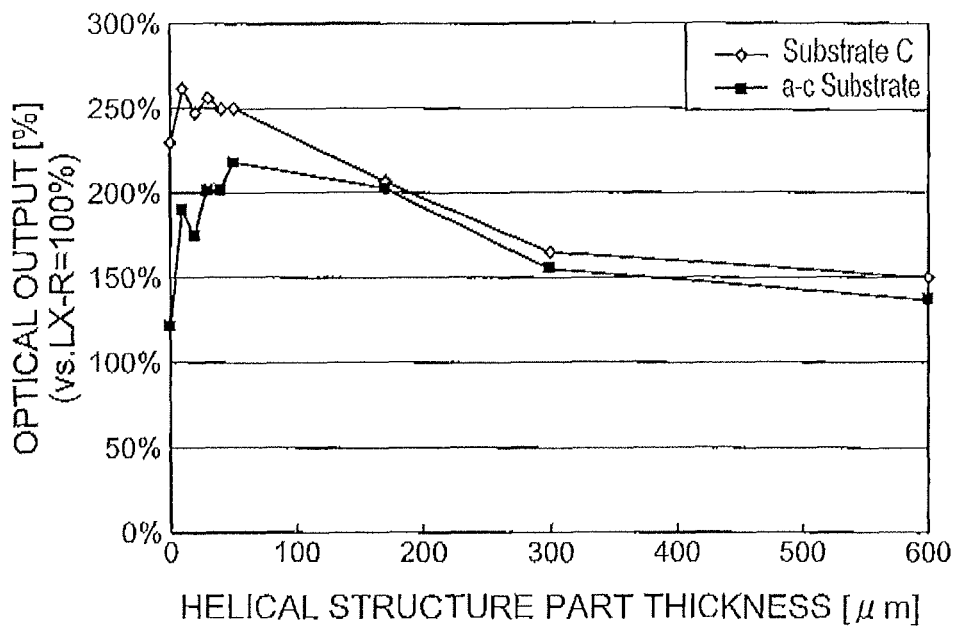
(b)
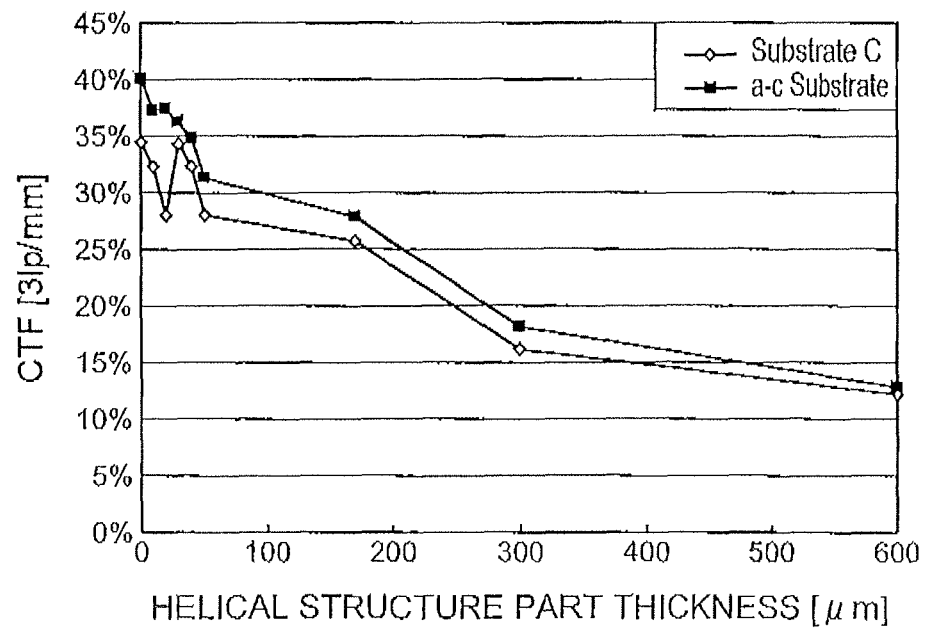

RADIATION IMAGE CONVERSION PANEL AND METHOD FOR PRODUCING SAME

TECHNICAL FIELD

The present invention relates to a radiation image conversion panel equipped with a radiation conversion layer constituted by a plurality of columnar crystals (acicular crystals) and a method for producing the same.

BACKGROUND ART

Radiation image conversion panels equipped with radiation conversion layers constituted by a plurality of columnar crystals (acicular crystals) have conventionally been known. A radiation image conversion panel of this kind is constructed by providing a phosphor layer in which crystals of a phosphor are grown like columns on a base constituted by amorphous carbon, for example. Since the base such as amorphous carbon has such a low reflectance as to make it hard to enhance the light utilization efficiency by itself, radiation image conversion panels formed with reflective layers made of thin films of metals such as aluminum have conventionally been known (see Patent Literatures 1 and 2). On the other hand, there has been known a radiation image conversion panel in which, on a side face of columnar crystals, the width of their undulation is made to fall within a predetermined range, so as to enhance the linearity of the columnar crystals, thereby improving the quality of radiation images (see, for example, Patent Literature 3). Further, a radiation image conversion panel having enhanced its reflectance without forming reflective layers has been known (see, for example, Patent Literature 4).

CITATION LIST

Patent Literature

Patent Literature 1: Japanese Patent Application Laid-Open No. 2002-236181
Patent Literature 2: Japanese Patent Application Laid-Open No. 2003-75542
Patent Literature 3: Japanese Patent Application Laid-Open No. 2005-164380
Patent Literature 4: Japanese Patent Publication No. 3987469

SUMMARY OF INVENTION

Technical Problem

The above-mentioned radiation image conversion panel disclosed in Patent Literature 4 enhances its reflectance by contriving the structure of columnar crystals.

However, the following problems exist in the radiation image conversion panel disclosed in Patent Literature 4, since each columnar crystal is formed by a lower layer in which a plurality of spherical crystal particles are perpendicularly stacked like beads and a columnar crystal layer formed thereon. Suppose that a plurality of columnar crystals 100, 101, 102 exist as illustrated in FIG. 13(*a*), for example. The plurality of columnar crystals 100, 101, 102 have spherical crystal particles 100*a*, 100*b*, 100*c*; 101*a*, 101*b*, 101*c*; 102*a*, 102*b*, 102*c*, which are stacked one on top of another like beads, so as to construct a lower layer, on which respective columnar crystal parts 100*d*, 101*d*, 102*d* are mounted. In this case, respective crystal particles in adjacent pairs of the columnar crystals 100, 101, 102 are in contact with each other.

Since each crystal particle has a curved surface such as a spherical surface, the crystal particles 100*a*, 100*b*, 100*c* come into contact with their adjacent crystal particles 101*a*, 101*b*, 101*c* to a certain extent from the most protruded portions, so as to form contact portions c as illustrated in FIG. 13(*b*), for example. However, noncontact portions appear in locations remote from the contact portions c, which cannot help forming voids v between the adjacent columnar crystals 100, 101.

Therefore, in the radiation image conversion panel disclosed in Patent Literature 4, the phosphor density is low in the lower layer where the spherical crystal particles exist, which functions as a reflective layer having a light reflection characteristic, whereby the reflectance cannot be enhanced. In addition, the contact portions c, when formed, worsen the contrast (resolution) of radiation images, When the contact portions c are not formed, on the other hand, the phosphor density in the reflective layer becomes so low that the reflection effect decreases, though the drop in contrast is alleviated.

For raising the luminance without lowering the contrast of radiation images, it is necessary that one spherical crystal particle and a columnar crystal on the upper side thereof be formed continuous with each other. This is because, when they are not formed continuous with each other, light reflected by the spherical crystal is incident on columnar crystals (i.e., adjacent columnar crystals) other than the one on the upper side, thereby lowering the contrast, even though the whole panel enhances its luminance. However, even when they are formed continuous with each other, the spherical crystal particles separate the columnar crystals (100*d*, 101*d*, 102*d*) thereon farther from each other, so as to lower the packing density of columnar crystals within the panel surface, thereby deteriorating the radiation conversion efficiency. In contrast, making the spherical crystal particles smaller reduces the distance between the columnar crystals (100*d*, 101*d*, 102*d*) but lowers the reflection effect and further weakens the mechanical strength of the spherical crystal portion. Also, the voids v still exist as mentioned above and hinder the reflectance from rising.

For overcoming the problems mentioned above, it is an object of the present invention to provide a radiation image conversion panel which can enhance the reflectance without forming a reflective layer made of a thin metal film or the like and exhibit a reflectance higher than that in the case where the reflective layer is formed by spherical crystal particles, and a method for producing the same.

Solution to Problem

For achieving the above-mentioned object, the radiation image conversion panel in accordance with the present invention is a radiation image conversion panel having a radiation conversion layer, formed on a substrate, for converting an incident radiation into light; wherein the radiation conversion layer has a reflective layer, on a side opposite from a light exit surface for emitting the light, for reflecting the light to the exit surface side; and wherein the reflective layer has a helical structure comprising helically stacked phosphor crystals.

This radiation image conversion panel can enhance the crystal density in the reflective layer, since the reflective layer has a helical structure in which phosphor crystals are stacked helically. This can enhance the reflectance without forming a reflective layer made of a thin metal film or the like and exhibit a reflectance higher than that in the case where the reflective layer is formed by spherical crystal particles.

Preferably, the radiation conversion layer is constituted by a plurality of columnar crystals in which the phosphor crystals are stacked like columns, while each of the columnar crystals has the helical structure formed on a root side secured to the substrate and a columnar structure extending from the helical structure to the light exit surface side along a direction intersecting the substrate, the helical structure and the columnar structure being constructed by continuously stacking the phosphor crystals. This configuration can enhance the luminance without lowering the contrast of radiation images, since the light reflected by the helical structure is incident on the columnar structure stacked continuously with the helical structure.

Preferably, the radiation conversion layer is constituted by a plurality of columnar crystals in which the phosphor crystals are stacked like columns, the helical structure is formed on a root side of the plurality of columnar crystals secured to the substrate, and helical structure parts forming the helical structures of first and second columnar crystals adjacent to each other in the plurality of columnar crystals have a nested structure in which the second columnar crystal is nested in voids of the first columnar crystal vertically separated from each other. This configuration can reduce the distance between the columnar crystals while keeping the crystal density and size of the helical structure that can exhibit sufficient reflection effect and mechanical strength, thereby raising the luminance without lowering the radiation conversion efficiency.

Here, more preferably, a portion on the second columnar crystal side in the helical structure part of the first columnar crystal and a portion on the first columnar crystal side in the helical structure part of the second columnar crystal overlap each other as seen in a direction intersecting the substrate, while a gap between the helical structure part of the first columnar crystal and the helical structure part of the second columnar crystal is wavy as seen in a direction orthogonal to the direction intersecting the substrate. This configuration can farther reduce the distance between the columnar crystals while reliably keeping the crystal density and size of the helical structure that can exhibit sufficient reflection effect and mechanical strength.

Preferably, in the radiation conversion layer, a plurality of helical loops forming the helical structure are stacked in a direction intersecting the substrate or a plurality of flat spherical parts forming the helical structure are stacked obliquely with respect to a direction orthogonal to the substrate. These configurations secure the reflection function in the helical structure parts and thus can enhance the reflectance in the reflective layer. Further, the flat spherical part connected to the columnar structure in the flat spherical parts is preferably not greater than the column diameter of the columnar structure (i.e., the width of the flat spherical part connected to the columnar structure in the flat spherical parts is preferably smaller than that of the columnar structure in a direction orthogonal to the direction intersecting the substrate). In this case, the scintillation light generated in the columnar structure near the flat spherical part can efficiently be reflected so as to be directed to the leading end without decay.

When a plurality of helical loops are stacked in the radiation conversion layer, in the reflective layer, the phosphor crystals are preferably bent laterally in a cross section in a direction intersecting a surface of the substrate, more preferably, in the radiation conversion layer, the helical loops have an interval on the order of about 0.67 μm to about 5 μm in a direction intersecting the substrate. When the helical loops have such an interval, the phosphor crystals clearly appear to be bent laterally in the cross section intersecting the surface of the substrate.

There are cases where the radiation conversion layer is constituted by a scintillator containing CsI or a photostimulable phosphor containing CsBr.

A substrate made of a material containing a carbon fiber such as CFRP, for example, has a structure less uniform in surface directions of the substrate as compared with substrates made of amorphous carbon, metals, glass, and the like. Therefore, the substrate made of a material containing a carbon fiber causes a difference in substrate absorptance of the emitted light, thereby influencing light images issued from the panel. The substrate made of a material containing a carbon fiber also has a structure in which the radiation transmission characteristic is not uniform in surface directions. Therefore, when capturing a radiation image at a low radiation intensity state (low energy) in particular, the ratio of the radiation reaching the radiation conversion layer will become nonuniform in surface directions if the transmission characteristic varies in the surface directions, thereby influencing the resulting images. A reflective film for reflecting the light emitted by the radiation conversion layer may be formed between the substrate and the radiation conversion layer, so as to enhance the total luminance, whereby such influences can be reduced, though the contrast is lowered thereby. In comparison, the configuration of the radiation image conversion panel in accordance with the present invention can yield favorable luminance and contrast even in a nonuniform substrate made of a material containing a carbon fiber.

The method for producing a radiation image conversion panel in accordance with the present invention is a method for producing a radiation image conversion panel having a radiation conversion layer, formed on a substrate, for converting an incident radiation into light, the method comprising vapor-depositing a vapor deposition source to become the radiation conversion layer onto the substrate while rotating a mount table mounting the substrate and an aperture for evaporating therethrough the vapor deposition source from a vapor deposition container accommodating the vapor deposition source about an axis of rotation extending in a direction intersecting the substrate with such a rotational speed difference that the aperture moves relatively slower than the substrate, so as to form, on a side opposite from a light exit surface for emitting the light in the radiation conversion layer, a reflective layer for reflecting the light to the exit surface side.

Preferably, when constructing the radiation conversion layer by a plurality of columnar crystals in which the phosphor crystals are continuously stacked like columns, the method comprises the steps of vapor-depositing the vapor deposition source onto the substrate while rotating the aperture at a first rotational speed, so as to form a helical structure comprising helically stacked phosphor crystals as the reflective layer, and vapor-depositing the vapor deposition source onto the substrate while rotating the aperture at a second rotational speed slower than the first rotational speed, so as to form a columnar structure extending from the helical structure to the light exit surface side along a direction intersecting the substrate integrally with the helical structure. Alternatively, the method for producing a radiation image conversion panel according to claim 12 comprises the steps of vapor-depositing the vapor deposition source onto the substrate while rotating the substrate at a first rotational speed, so as to form a helical structure comprising helically stacked phosphor crystals as the reflective layer, and vapor-depositing the vapor deposition source onto the substrate while rotating the substrate at a second rotational speed faster than the first rotational speed, so as to form a columnar structure extending from the helical structure to the light exit surface side along a direction intersecting the substrate integrally with the helical structure.

Such a method for producing a radiation image conversion panel can reliably yield the radiation image conversion panel in accordance with the present invention mentioned above.

Advantageous Effects of Invention

As in the foregoing, the present invention provides a radiation image conversion panel which can enhance the reflectance without forming a reflective layer made of a thin metal film or the like and exhibit a reflectance higher than that in the case where the reflective layer is formed by spherical crystal particles and high luminance, and a method for producing the same. While the contrast (resolution) deteriorates when the luminance is raised by the reflection effect in general, the contrast can be made higher than in the case where a reflective layer such as a thin metal film is formed.

BRIEF DESCRIPTION OF DRAWINGS

FIG. 6 is a chart showing the relationship between the rotational speed difference employed at the time of production and the reflectance in each of radiation image conversion panels produced by performing crystal growth at several rotational speed differences for a plurality of kinds of substrates;

FIG. 8 is a graph representing the relationship between the thickness of the helical structure part and optical output and the relationship between the thickness of the helical structure part and CTF in each of two kinds of substrates;

DESCRIPTION OF EMBODIMENTS

In the following, embodiments of the present invention will be explained with reference to the drawings. In the explanation of the drawings, the same constituents will be referred to with the same signs while omitting their overlapping descriptions.

Structure of a Radiation Image Conversion Panel

Figure 1:
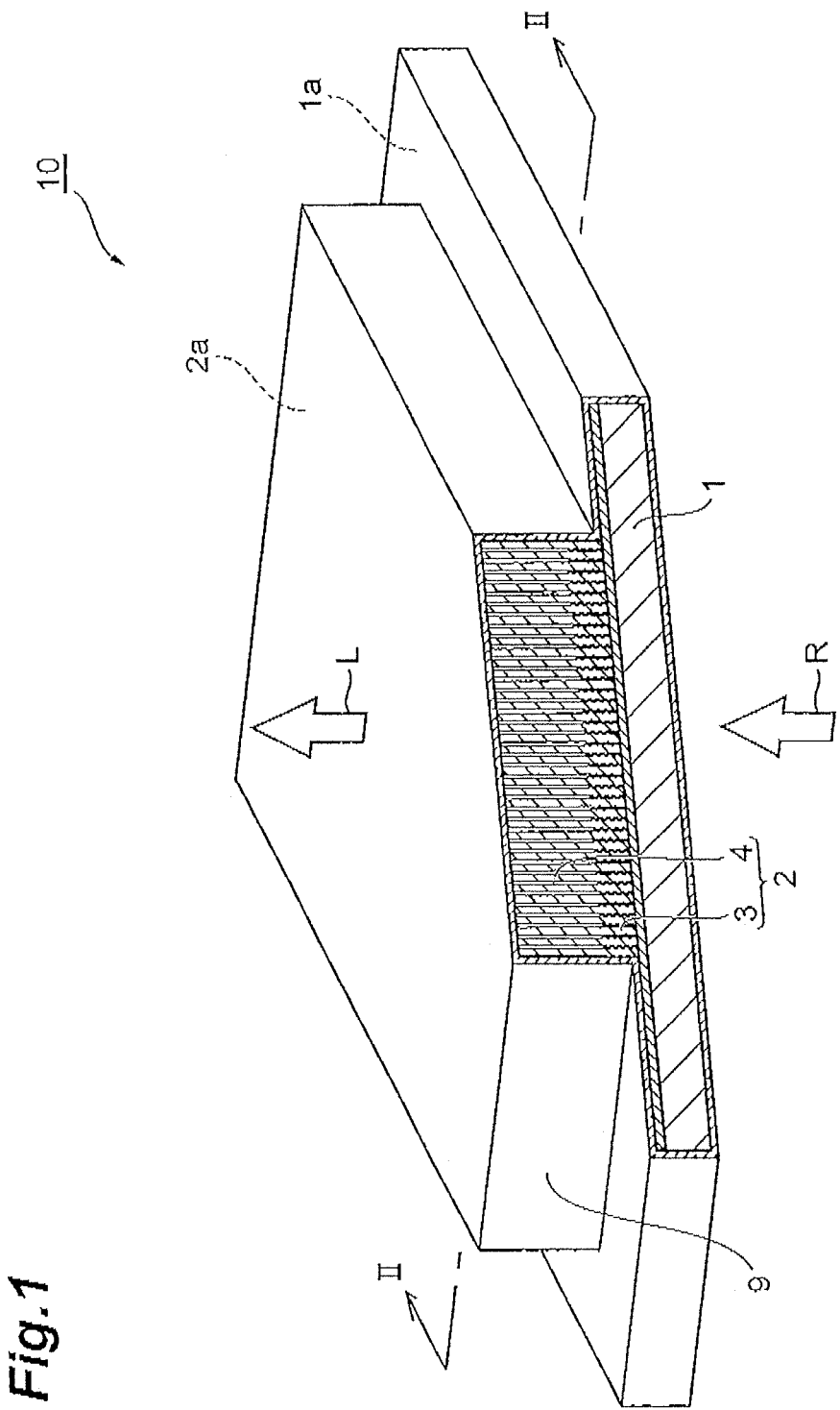
FIG. 1 is a perspective view of a radiation image conversion panel in accordance with an embodiment of the present invention.
Figure 2:
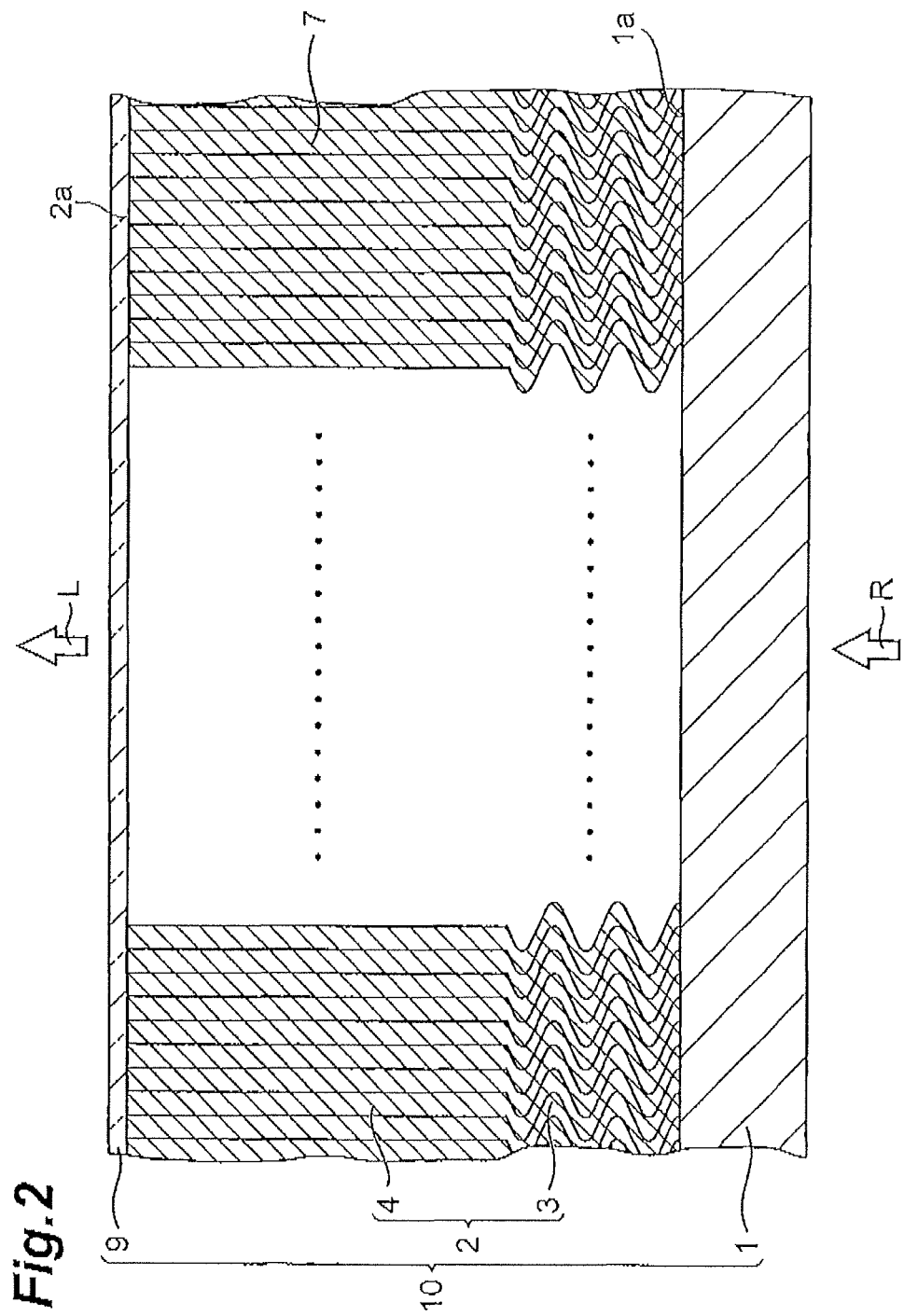
FIG. 2 is a sectional view taken along the line II-II of FIG. 1.

FIG. 1 is a perspective view of a radiation image conversion panel 10 in accordance with an embodiment of the present invention, while FIG. 2 is a sectional view taken along the line II-II of FIG. 1. The radiation image conversion panel 10 has a substrate 1 and a radiation conversion layer 2 formed on the substrate 1, while the substrate 1 and radiation conversion layer 2 are coated with a protective layer 9. The protective layer 9 is a protective film (an organic film such as poly(p-xylylene) or an inorganic film) which covers at least the radiation conversion layer 2 in order to protect the radiation conversion layer 2 against moisture and the like.

Figure 3:
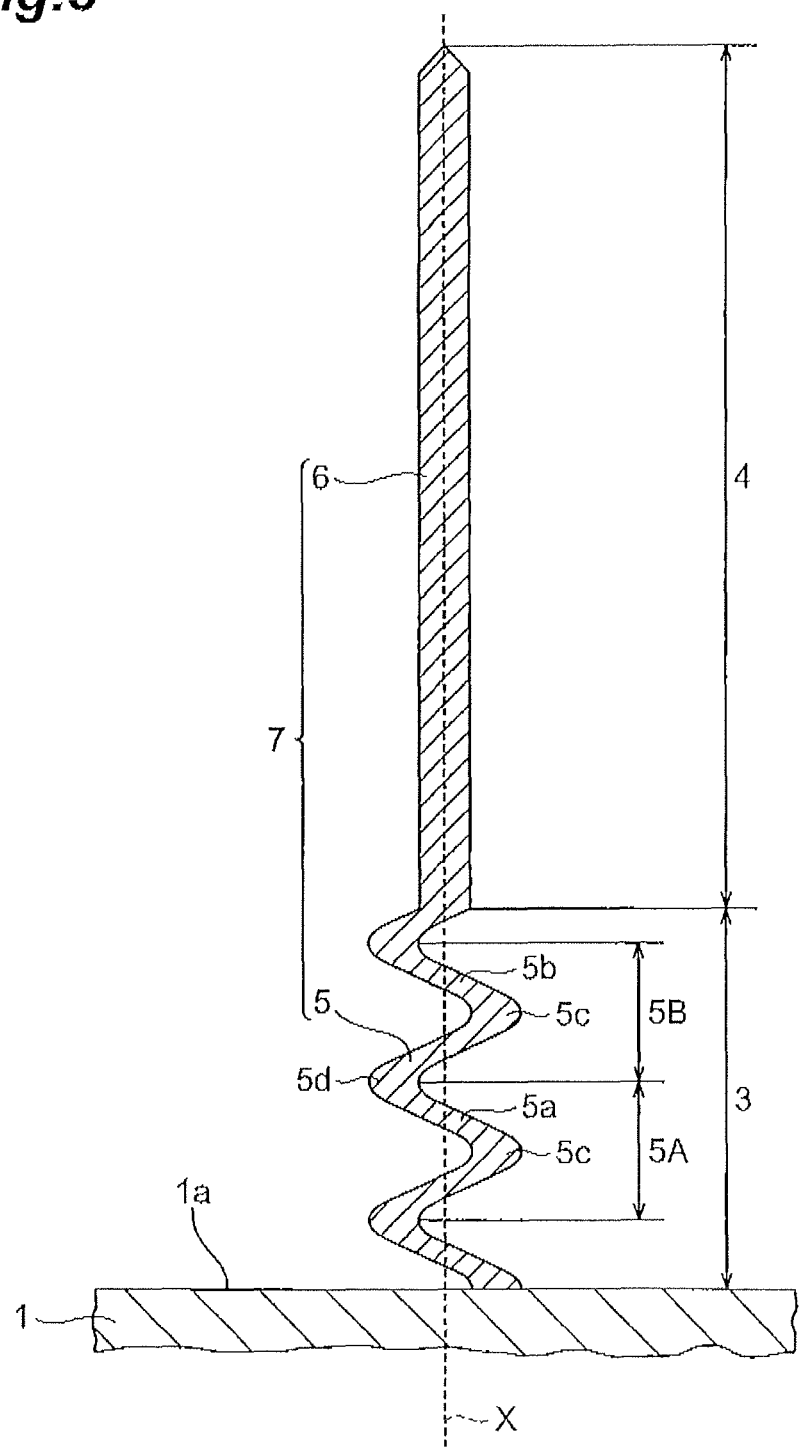
FIG. 3 is a sectional view, taken in a direction orthogonal to a substrate, of a columnar crystal constituting a radiation conversion layer.

The substrate 1 is a sheet material made of amorphous carbon, aluminum, or the like, whose surface 1a on the side formed with the radiation conversion layer 2 is made flat. The radiation conversion layer 2 converts a radiation R incident thereon from the outside of the substrate 1 into a light image corresponding thereto and emits light L constituted by thus converted light image and a light image reflected by a reflective layer 3, which will be explained later, from a light exit surface 2a. The radiation conversion layer 2 includes the reflective layer 3 and a columnar layer 4, while having a structure in which a number of columnar crystals 7, which are acicular crystals as illustrated in FIG. 3, are assembled together, the number of columnar crystals 7 forming the reflective layer 3 and columnar layer 4. The thickness of the radiation conversion layer 2 is on the order of about 50 μm to about 1000 μm, in which the reflective layer 3 occupies about 1% to about 10% and has a thickness on the order of about 5 μm to about 50 μm.

The columnar crystals 7 are obtained by growing crystals of a scintillator (CsI) or a photostimulable phosphor (CsBr), so that their root part on the substrate 1 side becomes a helical structure part 5, while a part on the upper side of the helical structure part 5 (on the light exit surface 2a side) forms a columnar part 6. In each columnar crystal 7, the helical structure part 5 and the columnar part 6 are formed integrally with each other by continuously stacking crystals of the scintillator or the like. The outer diameter of the columnar part 6 is smaller than that of the helical structure part 5, so that the columnar crystal 7 is formed into a taper shape which becomes thicker on the leading end side (on the side opposite from the substrate 1). The leading edge is pointed, so that the columnar part excluding the pointed part is formed into the taper shape. The difference in height of irregularities on side faces of the columnar part 6 is smaller than that of irregularities on side faces of the helical structure part 5. In other words, the side face of the columnar part 6 is substantially linear as seen in a direction intersecting the center axis X. In still other words, a cross section taken along the center axis X of the columnar part 6 excluding the pointed part at the leading edge thereof has a substantially rectangular form (the cross section has a trapezoidal form in a strict sense, since the columnar part is tapered), Thus configured columnar part 6 is produced when a method disclosed in Japanese Patent Application Laid-Open No. 2005-241430 (a method of vapor-depositing a material for the columnar part while rotating the substrate at 10 rpm) is performed, for example.

The helical structure part 5 is constructed by helically stacking crystals of a scintillator or the like from, the surface 1a and has a helical structure in which each one-turn part (helical loop) about the center axis X is formed substantially regularly in a direction orthogonal to the surface 1a. In FIG. 3, the areas represented by 5A and 5B constitute respective helical loops, The size of the helical loop (which may also be referred to as "helical pitch" in the following) in the direction orthogonal to the surface 1a is on the order of about 0.5 μm to about 15 μm, while a plurality of (e.g., 5 to about 15) substantially the same helical loops are stacked one on top of another, so as to construct the helical structure part 5.

As illustrated in FIG. 3, the helical structure part 5 has a bent structure obtained by substantially regularly bending crystals of a scintillator or the like leftward and rightward with respect to the center axis X in a repeated manner and connecting a plurality of V-shaped parts 5a, 5b together. In each of the V-shaped parts 5a, 5b, a portion which is most protruded on the right side in FIG. 3 is a turnover portion 5c, while their connecting portion is a joint 5d.

The columnar part 6 is formed as a straight portion subsequent to the helical structure part 5 and has a columnar structure in which crystals of a scintillator or the like are formed so as to extend substantially linearly along a direction intersecting the surface 1a. The helical structure part 5 and the columnar part 6 are continuously formed integrally with each other by vapor deposition.

In the case where the columnar crystal 7 is a scintillator crystal, the radiation incident on the columnar crystal 7 is converted into light (scintillation light), which is guided through the columnar part 6, so as to be emitted from the leading end side (the side opposite from the substrate 1). In the case where the columnar crystal 7 is a photostimulable phosphor crystal, on the other hand, radiation information corresponding to the incident radiation is accumulatively recorded, and upon irradiation with a red laser beam or the like as pumping light, light corresponding to the accumulated information is guided through the columnar part 6, so as to be emitted from the leading end side (on the side opposite from the substrate 1). Of the light guided though the columnar crystal 7, the part guided to the reflective layer 3 side is reflected by the reflective layer 3, so as to increase the quantity of light emitted from the leading end side.

Figure 4:
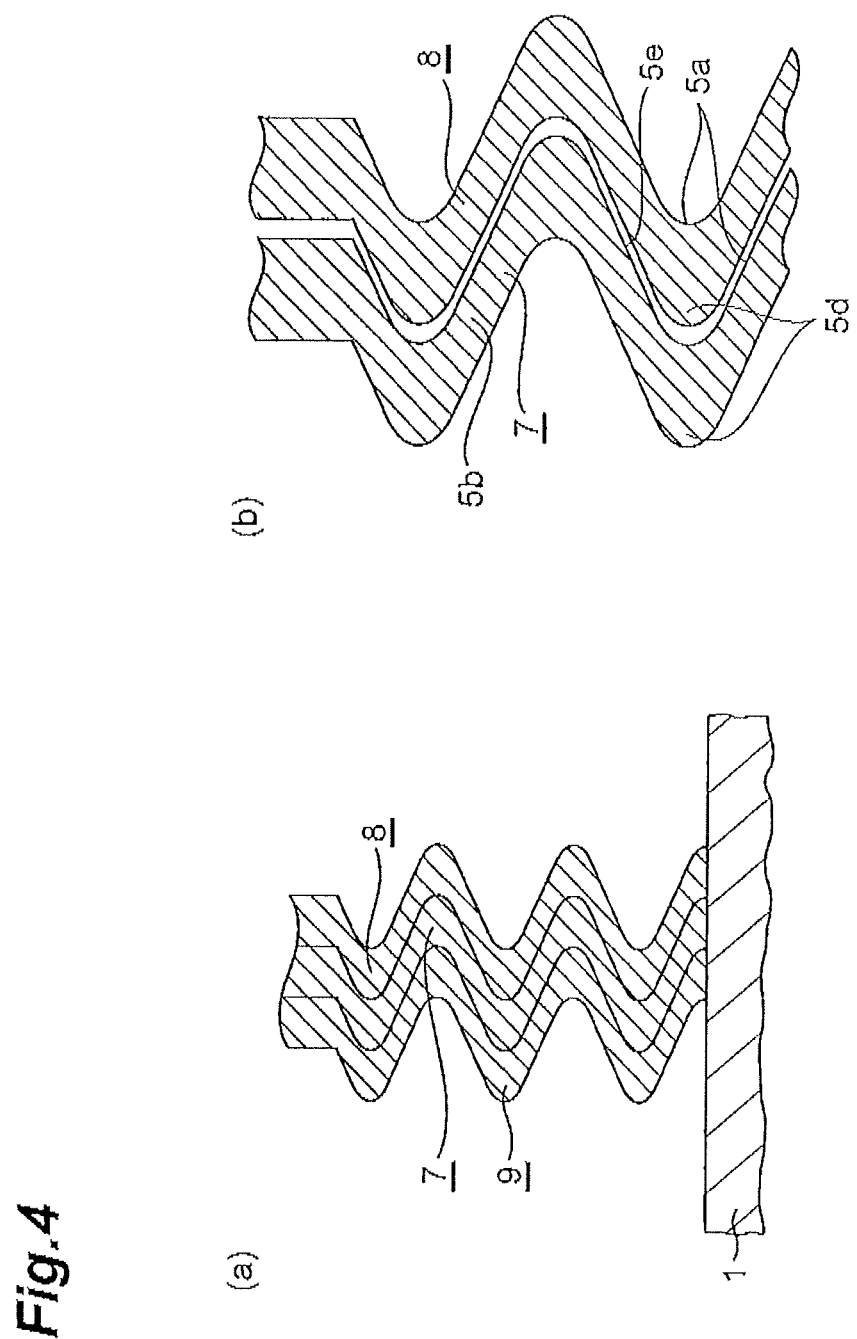
FIG. 4 is a sectional view, taken in the direction orthogonal to the substrate, illustrating a helical structure part in the columnar crystal of FIG. 3.

As illustrated in FIG. 4(a), the columnar crystal 7 has a nested structure in terms of, the relationship with respect to each of its adjacent columnar crystals 8, 9 on both sides, in which one is nested between vertically separated portions of the other. That is, as illustrated in FIG. 4(b) enlarging FIG. 4(a), the columnar crystals 7, 8 have a nested structure in which the joint 5d of the columnar crystal 8 is nested in a void 5e formed between the V-shaped portions 5a, 5b on the right side of the joint 5d of the columnar crystal 7.

Because of the nested structure, the portion on the columnar crystal 8 side in the helical structure part 5 of the columnar crystal 7 and the portion on the columnar crystal 7 side in the helical structure part 5 of the columnar crystal 8 overlap each other as seen in a direction perpendicular to the surface 1a of the substrate 1. More specifically, the turnover portion 5c of the columnar crystal 7 and the joint 5d of the columnar crystal 8 overlap each other as seen from the upper side. The gap between the helical structure part 5 of the columnar crystal 7 and the helical structure part 5 of the columnar crystal 8 is wavy as seen in a direction parallel to the surface 1a of the substrate 1 (from the side face side of the substrate 1).

Of thus constructed columnar crystal 7, the helical structure part 5 and the columnar part 6 constitute the reflective layer 3 and the columnar layer 4, respectively. The reflective layer 3 has a function of reflecting the light L in order to scatter the light L incident thereon by irregularly reflecting the light L. Therefore, the radiation image conversion panel 10 exhibits a favorable light reflection characteristic even without a light reflective film made of a metal film or the like for enhancing the reflectance and thus can increase the amount of light emitted from the light exit surface 2a, thereby making it possible to enhance the sensitivity for detecting the radiation. The radiation image conversion panel 10 is not formed with metal films for enhancing the sensitivity for detecting the radiation and thus is free from the fear of corrosion resulting from the metal films.

Also, in the radiation image conversion panel 10, the reflective layer 3 is constituted by the helical structure part 5 in the columnar crystal 7. As mentioned above, the columnar crystal 7 has a nested structure in which those adjacent to each other are nested in each other in the helical structure part 5, whereby the space in which no crystals of the scintillator or the like exist can be made very small. This enhances the density of crystals of the scintillator or the like in the reflective layer 3, thereby exhibiting high reflectance.

As mentioned above, employing the nested structure forming a little void in the helical structure part 5 can prevent the light reflected by the helical structure part 5 from being guided by the adjacent columnar crystal 7 in contact therewith, if any, and lowering the contrast. Even when a little void is formed in the helical structure part 5, the packing density of the columnar parts 6 within the panel surface can be raised, so as to increase the radiation conversion efficiency. The packing density of the helical structure parts 5 can also be raised within the panel surface, so as to improve the reflectance. For enhancing the contrast, it is desirable that all the columnar crystals 7, including the helical structure parts, within the panel surface be separated into the discrete columnar crystals 7. Since the columnar crystals 7 are formed by vapor deposition, it is difficult for all the columnar crystals 7 to be separated completely from each other. However, a favorable radiation image conversion panel 10 can be obtained if they are formed such as to be roughly separated from each other.

Method for Producing the Radiation Image Conversion Panel

Figure 5:
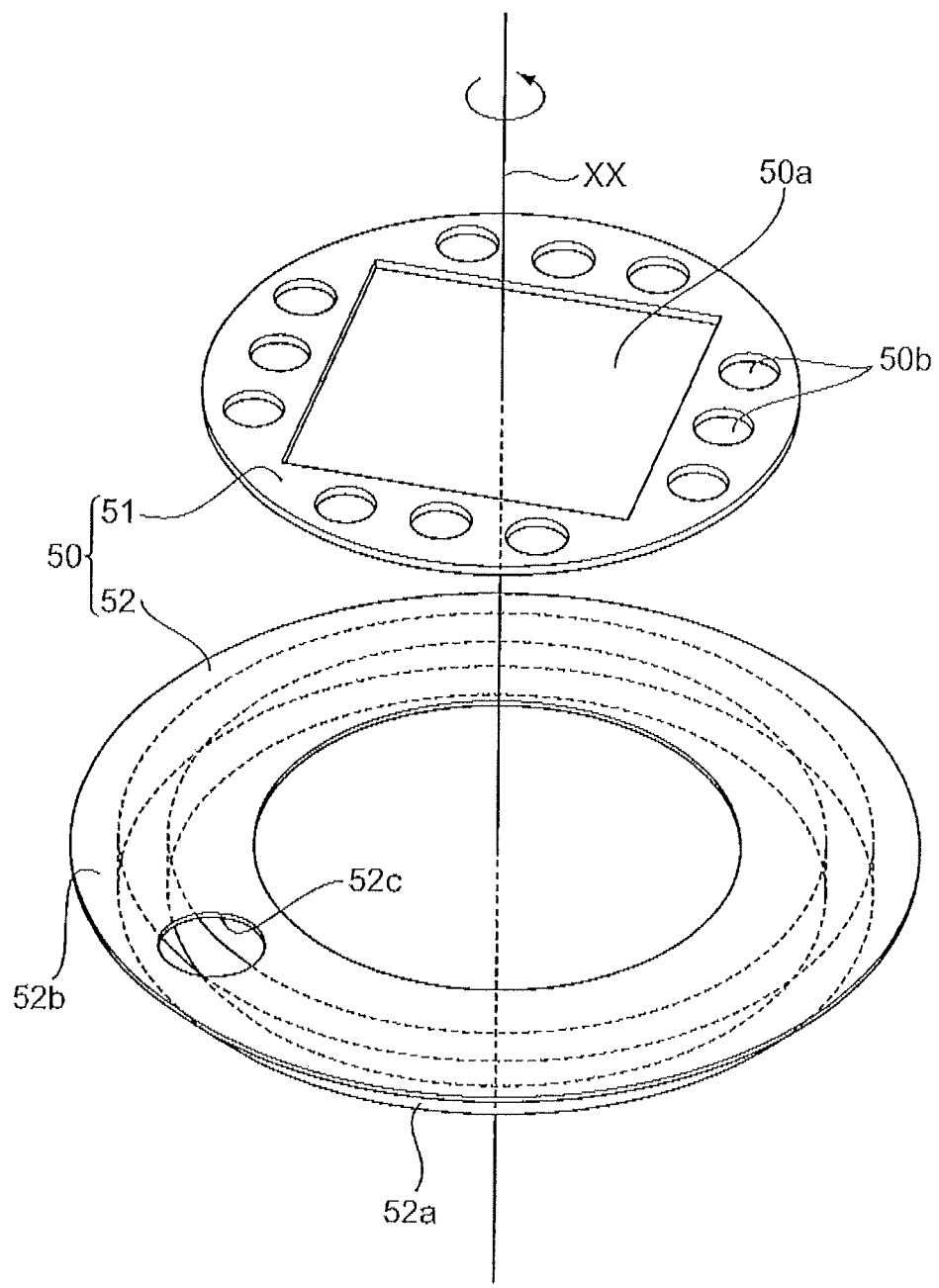
FIG. 5 is a perspective view illustrating a main part of a manufacturing device used for producing the radiation image conversion panel.

A method for producing the radiation image conversion panel 10 will now be explained. The above-mentioned radiation image conversion panel 10 can be produced as follows, for example. FIG. 5 is a perspective view illustrating a main part of a manufacturing device 50 used for producing the radiation image conversion panel 10. The manufacturing device 50 has a disk 51 for mounting a substrate and a vapor deposition container 52. The disk 51 and the vapor deposition container 52 are accommodated in a vacuum device which is not depicted.

The disk 51 has a mount 50a, located at its center, for mounting the substrate 1, while a plurality of apertures 50b are formed thereabout in order to reduce its weight. The vapor deposition container 52 has an annular storage 52a, in which a vapor deposition source for a scintillator or the like is accommodated. A flat surface 52b of the storage 52a on the disk 51 side is closed except for an aperture 52c formed in a part thereof. The aperture 52c is opened and closed by a shutter (not depicted).

In response to a driving force from a rotary drive device which is not depicted, the disk 51 and vapor deposition container 52 rotate such that their rotary axes coincide with an axis XX. Also, the vapor deposition container 52 is heated, so as to evaporate the vapor deposition source accommodated in the storage 52a, and the shutter is opened, so as to stack the evaporated vapor deposition source onto the substrate 1, thereby growing crystals, thus forming the radiation conversion layer 2.

Here, their numbers of rotations per unit time are made different from each other so that the rotational speed of the vapor deposition container 52 is slower than that of the disk 51.

Assuming that the difference between the number of rotations of the disk 51 per unit time (i.e., the number of rotations of the substrate 1 per unit time) and the number of rotations of the vapor deposition container 52 per unit time the number of rotations of the aperture 52*c* per unit time) is the rotational number difference, the above-mentioned helical structure parts 5 appear in the columnar crystals 7 of the radiation conversion layer 2 when the rotational number difference is smaller than a certain value (which will also be referred to as critical rotational number difference and explained later in detail). Therefore, crystals are grown while the rotational number difference is made smaller than the certain value for some extent of time from the start of production, so as to form the above-mentioned helical structure parts 5. Thereafter, the columnar parts 6 are formed with a greater rotational number difference, whereby the radiation image conversion panel 10 can be produced.

When the crystals are grown while the disk 51 and the vapor deposition container 52 are rotated as in the foregoing, the vapor deposition source overlaps a part where the vapor deposition source has already been deposited on the substrate 1 or a position shifted therefrom. When the rotational number difference is smaller than the critical rotational number difference, however, it seems that the tendency of the vapor deposition source to pile up while shifting its position little by little so as to draw a circle from a part where it has already been deposited becomes so remarkable that crystals grow while the vapor deposition source stacks up helically, thereby forming the helical structure part 5.

FIG. 6 is a chart showing the relationship between the rotational number difference employed at the time of production and the reflectance in each of radiation image conversion panels produced by performing crystal growth at several rotational number differences for a plurality of kinds of substrates while using the above-mentioned manufacturing device 50. In this embodiment, four kinds of substrates, i.e., an a-c (amorphous carbon) substrate, a glass substrate, a substrate A (a substrate in which aluminum was formed as a reflective film on an aluminum substrate), and a substrate B (a substrate, in which aluminum was formed as a reflective film on an aluminum substrate, exhibiting a reflectance higher than that of the substrate A), were prepared, and crystals were grown on each of them while changing the rotational number difference by using the same vapor deposition source. The rotational number differences employed were six kinds, i.e., 0.4, 0.5, 1, 3, 12, and 25. The case where the rotational number difference is 1 corresponds to one in which the disk 51 and the vapor deposition container 52 are rotated at rotational speeds of Y [rpm] and Y−1 [rpm], respectively (where Y is a positive value greater than 1; the rotational number difference is a positive value), for example.

FIG. 6 also lists the helical pitch in each of the radiation image conversion panels 10. As can be seen from FIG. 6, the reflectance of the radiation image conversion panel 10 is higher in each of the four kinds of substrates when the rotational number difference is reduced to 1 than when it is 25. While the helical pitch is 0.04 μm when the rotational number difference is 25, the former becomes greater as the latter decreases, e.g., the helical pitch is 0.67 μm and 2 μm when the rotational number difference is 3 and 1, respectively. When the rotational number difference is reduced to 1, the above-mentioned bent structure clearly appears in a cross section of the radiation conversion layer 2, which seems to imply that the reflective layer 3 is constituted by the helical structure parts 5.

Figure 7:
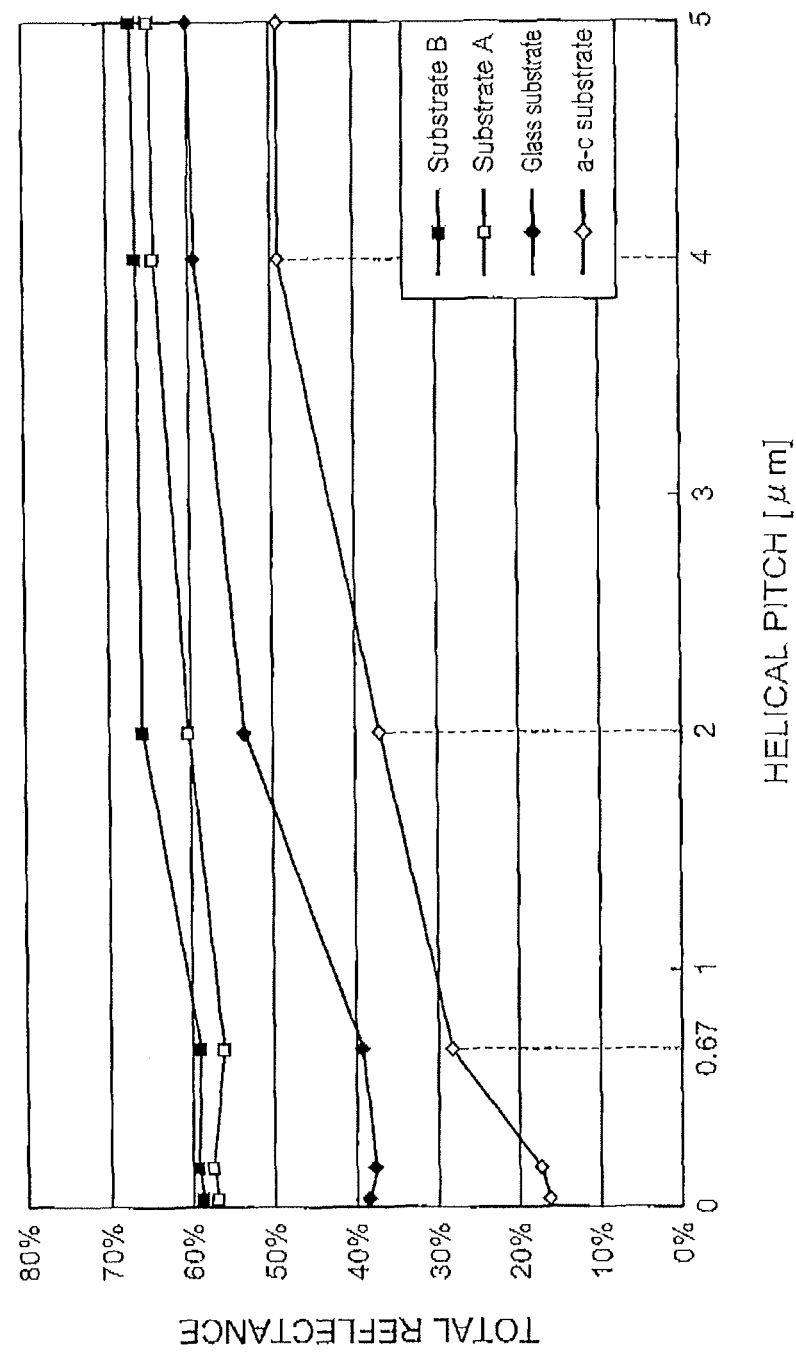
FIG. 7 is a graph representing the relationship between helical pitch and reflectance in each of four kinds of substrates.

FIG. 7 represents the relationship between the helical pitch and reflectance in each of the four kinds of substrates as a graph. As can be seen from FIG. 7, the reflectance improvement effect clearly appears in each of the substrates when the helical pitch is about 2 μm, i.e., when the rotational number difference is reduced to 1. When the rotational number difference is 0.4, which is smaller than 1, however, the helical pitch is 5 μm, while the reflectance at this time is substantially equal to that in the case where the rotational number difference is 0.5, which seems to imply that the helical pitch may be about 5 μm at a maximum.

In the a-c (amorphous carbon) substrate, in particular, the reflectance improvement effect appears clearly even when the helical pitch is 0.67 μm, which is smaller than 1 i.e., when the rotational number difference is 3. From the foregoing, the critical rotational number difference can be 3 in this embodiment.

While the a-c (amorphous carbon) substrate is jet black before forming the radiation conversion layer 2, the substrate color gradually becomes lighter from black to dark gray, gray, light gray, and so forth as the helical pitch becomes longer (the rotational number difference becomes smaller) when the radiation conversion layer 2 is formed with variable helical pitches (variable rotational number differences). This indicates that the reflectance of the radiation conversion layer 2 becomes higher as the helical pitch increases.

FIG. 8(*a*) is a graph representing the relationship between the thickness of the helical structure part 5 and optical output in each of two kinds of substrates, i.e., a substrate C (a substrate in which aluminum is formed as a reflective film on an aluminum substrate) and the a-c (amorphous carbon) substrate. FIG. 8(*b*) is a graph representing the relationship between the thickness of the helical structure part 5 and CTF (Contrast Transfer Function; image resolution) in each of the two kinds of substrates, i.e., the substrate C and the a-c substrate. It can be understood from FIG. 8 that, while the CTF is high when the thickness of the helical structure part 5 is about 50 μm, the former gradually decreases as the latter increases from about 50 μm. This makes it preferable for the thickness of the helical structure part 5 to be on the order of 10 μm to 50 μm.

Structure of Another Radiation Image Conversion Panel

Figure 9:
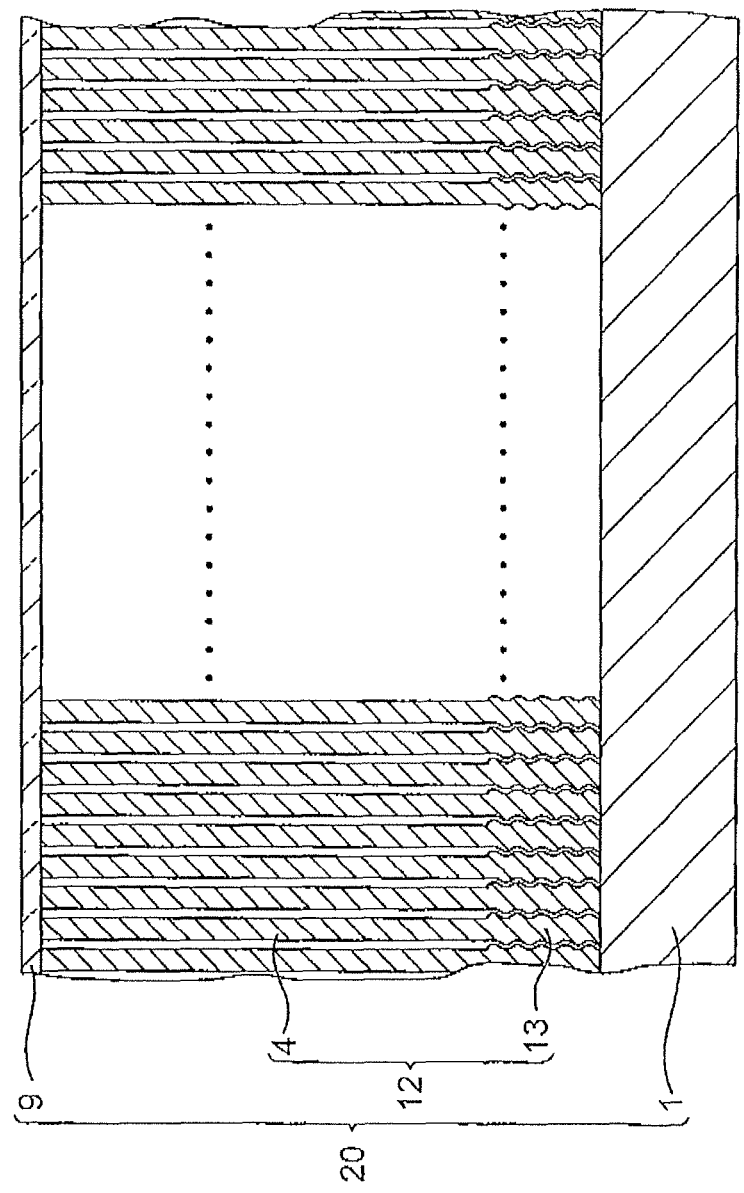
FIG. 9 is a sectional view, taken in the direction orthogonal to the substrate, of the radiation image conversion panel when the rotational speed difference is changed from that in FIG. 2.
Figure 10:
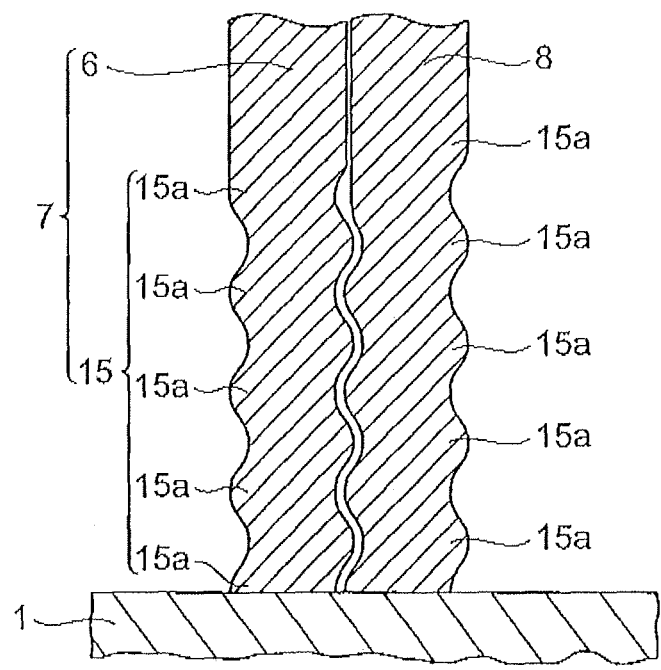
FIG. 10 is a sectional view, taken in the direction orthogonal to the substrate, of columnar crystals constituting a radiation conversion layer in the radiation image conversion panel of FIG. 9.
Figure 11:
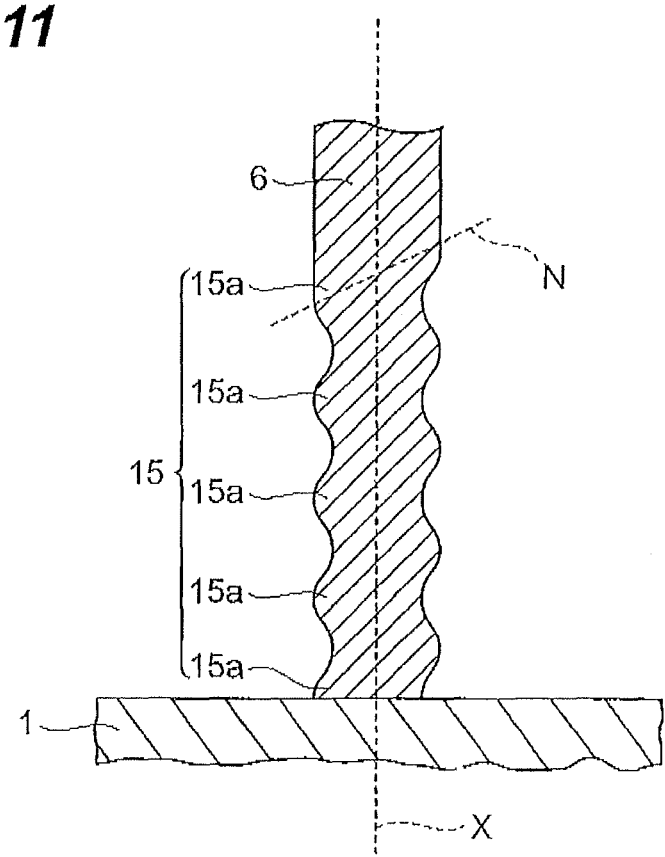
FIG. 11 is a sectional view, similarly taken in the direction orthogonal to the substrate, illustrating the helical structure part.

When the rotational number difference is 3, on the other hand, a radiation conversion layer 12 different from the radiation conversion layer 2 is formed on the substrate 1. FIG. 9 is a sectional view, taken in a direction orthogonal to a substrate, of a radiation image conversion panel 20 formed with the radiation conversion layer 12. FIG. 10 is a sectional view, similar to FIG. 9, illustrating two helical structure parts 15 constituting a reflective layer 13 of the radiation conversion layer 12. FIG. 11 is a sectional view, similar to FIG. 9, illustrating the helical structure part 15.

The radiation conversion layer 12 differs from the radiation conversion layer 2 in that it has the reflective layer 13. The reflective layer 13 differs from the reflective layer 3 in that the root part of the columnar crystals 7 on the substrate 1 side is a helical structure part 15. The helical structure part 15 has a plurality of flat spherical parts 15*a* which are stacked obliquely with respect to the center axis X (such that a flat surface N which will be explained later is inclined with respect to the center axis X). Bach flat spherical part 15*a* has a structure in which a sphere is compressed in a specific direction (e.g., a vertical direction) so as to project its lateral portions, while a plane passing the most extended part is defined as the flat surface N. The flat spherical part 15a is not limited to one in which a sphere is compressed in a specific direction, but may be a part corresponding to each of the above-mentioned helical loops in contact with each other (in the vertical direction). The flat spherical part 15a connected to the columnar part 6 (i.e., the uppermost part of the flat spherical parts 15a) does not become greater than the column diameter of the columnar part 6. In this case, the scintillation light generated in the columnar structure 6 near the flat spherical part 15a can efficiently be reflected so as to be directed to the leading end without decay.

As illustrated in detail in FIG. 11, the radiation conversion layer 12 has a continuous elliptical structure in which ellipses constituted by crystals of a scintillator or the like are stacked obliquely with respect to the center axis X in a cross section orthogonal to the substrate 1a, In each columnar crystal 7, the helical structure part 15 and the columnar part 6 are formed integrally with each other by continuously stacked crystals of the scintillator or the like.

As illustrated in FIG. 10, the columnar crystal 7 has a nested structure in terms of the relationship with respect to its adjacent columnar crystal 8, in which a portion of the flat spherical part 15a of one is nested between a pair of the flat spherical parts 15a in the other. Because of this nested structure, a portion on the columnar crystal 8 side of the helical structure part 15 in the columnar crystal 7 and a portion on the columnar crystal 7 side of the helical structure part 15 in the columnar crystal 8 overlap each other as seen in a direction perpendicular to the surface 1a of the substrate 1. The gap between the helical structure part 15 of the columnar crystal 7 and the helical structure part 15 of the columnar crystal 8 is wavy as seen in a direction parallel to the surface 1a of the substrate 1 (from the side face side of the substrate 1).

While the reflective layer 3 is constituted by the helical structure parts 15 in the radiation image conversion panel 20, the helical structure parts 15 have the nested structure and thus can reduce the size of spaces where no crystals of the scintillator or the like exist. This raises the density of crystals of the scintillator or the like in the reflective layer 13, thereby exhibiting high reflectance.

The radiation image conversion panel 20 is obtained when the rotational number difference is about 3 in the above-mentioned manufacturing device 50. The vapor deposition source piles up while shifting its position little by little from a part where it has already been deposited even when the rotational number difference is about 3, and its tendency to be deposited in the same part in an overlapping mariner is more remarkable than in the case where the rotational number difference is about 1, so that the helical loops reduce their vertical intervals, whereby the crystals grow in a compressed state. This seems to form the helical structure parts 15.

Figure 12:
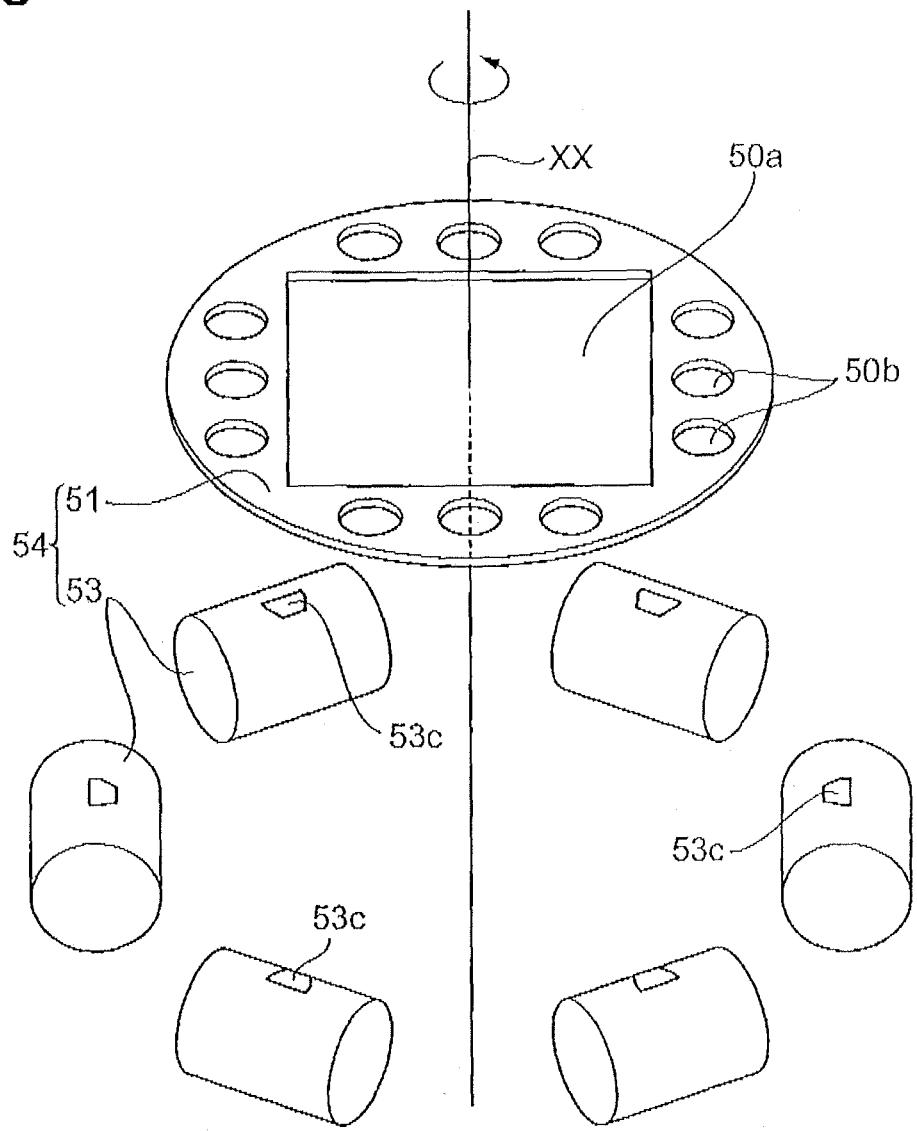
FIG. 12 is a perspective view illustrating a main part of another manufacturing device used for producing the radiation image conversion panel.
Figure 13:
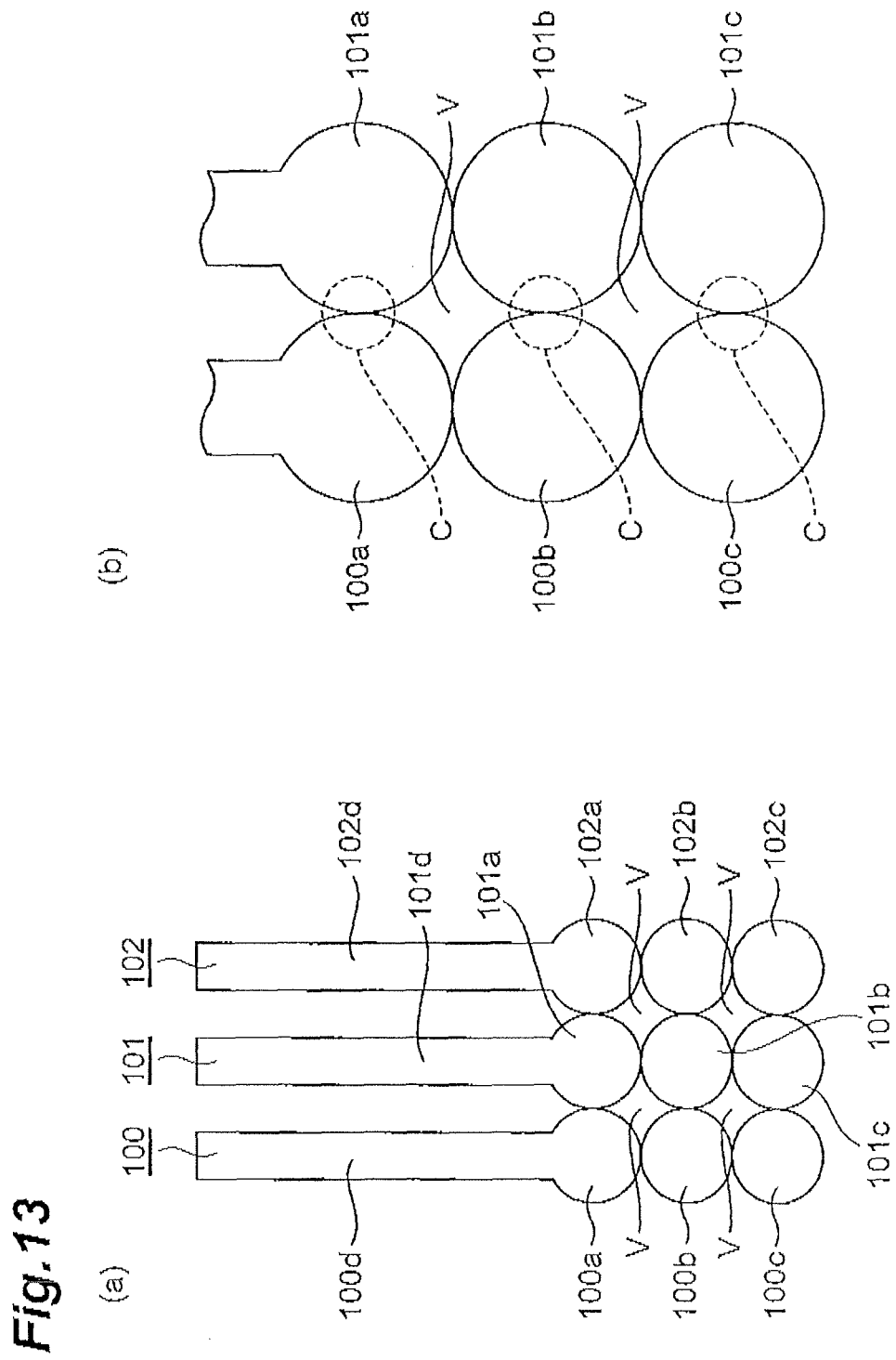
FIG. 13 (a) is a sectional view, taken in the direction orthogonal to the substrate, of columnar crystals constituting a radiation conversion layer of a conventional radiation image conversion panel, while (b) is a view enlarging its main part.

Each of the radiation image conversion panels 10, 20 can be produced by using a manufacturing device 54 illustrated in FIG. 12 in place of the manufacturing device 50. The manufacturing device 54 differs from the manufacturing device 50 in that it has a plurality of vapor deposition containers 53 instead of the vapor deposition container 52. Each of the vapor deposition containers 53 is a cylindrical container containing a vapor deposition source therein, while being partly formed with an aperture 53c, which is freely opened and closed by a shutter which is not depicted.

In the manufacturing device 50, the disk 51 and the vapor deposition container 52 rotate with their respective axes of rotation coinciding with the axis XX. In the manufacturing device 54, a plurality of vapor deposition containers 53 are arranged on one plane intersecting the axis XX and revolve about the axis XX on the plane. The manufacturing device 54 heats each vapor deposition container 53, so as to evaporate the vapor deposition source contained therein, while opening the shutter, so that the evaporated vapor deposition source piles up on the substrate 1, thereby growing crystals, thus forming the radiation conversion layer 2, 12.

Assuming that the difference between the number of rotations of the disk 51 per unit time the number of rotations of the substrate 1 per unit time) and the number of rotations of the vapor deposition containers 53 per unit time (i.e., the number of rotations of the apertures 53c per unit time) is the rotational number difference, the manufacturing device 50 also makes the rotational number difference smaller than a critical rotational number difference, thereby forming the helical structure parts 5 in the columnar crystals 7 of the radiation conversion layer 2. Thereafter, the rotational number difference is raised, so as to form the columnar parts 6.

The radiation conversion layers 2, 12 can also be formed by rotating only the apertures 52c, 53c of the vapor deposition containers 52, 53 such that their rotational speed is slower and faster at the time of forming the reflective layer 3 (helical structure part 5) and columnar layer 4 (columnar part 6), respectively. Alternatively, the radiation conversion layers 2, 12 can be formed by rotating only the substrate 1 such that its rotational speed is slower and faster at the time of forming the reflective layer 3 (helical structure part 5) and columnar layer 4 (columnar part 6), respectively. In these cases, the rotational number difference represented in FIG. 6 directly becomes the rotational speed of the substrate 1 or the apertures 52c, 53c of the vapor deposition containers 52, 53, each making it possible to form the reflective layer 3 (helical structure part 5) with the pitches shown in FIG. 6.

The foregoing explanations are those concerning embodiments of the present invention and do not restrict the apparatus and method of the present invention, whereby various modified examples can easily be carried out. Apparatus or methods constructed by combining constituents, functions, features, or processing steps in the embodiments as appropriate are also included in the present invention.

INDUSTRIAL APPLICABILITY

The present invention provides a radiation image conversion panel which can enhance the reflectance without forming a reflective layer made of a thin metal film or the like and exhibit a reflectance higher than that in the case where the reflective layer is formed by spherical crystal particles, and a method for producing the same. It can also make the contrast higher than in the case where a reflective layer such as a thin metal film is formed, though the contrast (resolution) deteriorates when the luminance is enhanced by the reflection effect in general.

REFERENCE SIGNS LIST

1 . . . substrate;
2, 12 . . . radiation conversion layer;
3, 13 . . . reflective layer;
4 . . . columnar layer;
5 . . . helical structure part;
6 . . . columnar part;
7, 8, 9 . . . columnar crystal;
10, 20, . . . radiation image conversion panel;
50, 54 . . . manufacturing device;
51 . . . disk;
52, 53 . . . vapor deposition container

The invention claimed is:

1. A radiation image conversion panel having a radiation conversion layer, formed on a substrate, for converting an incident radiation into light;
   wherein the radiation conversion layer has a reflective layer, on a side opposite from a light exit surface for emitting the light, for reflecting the light to the exit surface side; and
   wherein the reflective layer has a helical structure comprising helically stacked phosphor crystals.

2. A radiation image conversion panel according to claim 1, wherein the radiation conversion layer is constituted by a plurality of columnar crystals in which the phosphor crystals are stacked like columns;
   wherein each of the columnar crystals has the helical structure formed on a root side secured to the substrate and a columnar structure extending from the helical structure to the light exit surface side along a direction intersecting the substrate; and
   wherein the helical structure and the columnar, structure are constructed by continuously stacking the phosphor crystals.

3. A radiation image conversion panel according to claim 1, wherein the radiation conversion layer is constituted by a plurality of columnar crystals in which the phosphor crystals are stacked like columns, the helical structure is formed on a root side of the plurality of columnar crystals secured to the substrate, and helical structure parts forming the helical structures of first and second columnar crystals adjacent to each other in the plurality of columnar crystals have a nested structure in which the second columnar crystal is nested in voids of the first columnar crystal vertically separated from each other.

4. A radiation image conversion panel according to claim 3, wherein a portion on the second columnar crystal side in the helical structure part of the first columnar crystal and a portion on the first columnar crystal side in the helical structure part of the second columnar crystal overlap each other as seen in a direction intersecting the substrate; and
   wherein a gap between the helical structure part of the first columnar crystal and the helical structure part of the second columnar crystal is wavy as seen in a direction orthogonal to the direction intersecting the substrate.

5. A radiation image conversion panel according to claim 1, wherein, in the radiation conversion layer, a plurality of helical loops forming the helical structure are stacked in a direction intersecting the substrate.

6. A radiation image conversion panel according to claim 5, wherein, in the reflective layer, the phosphor crystals are bent laterally in a cross section in a direction intersecting a surface of the substrate.

7. A radiation image conversion panel according to claim 5, wherein, in the radiation conversion layer, the helical loops have an interval on the order of about 0.67 µm to about 5 µm in a direction intersecting the substrate.

8. A radiation image conversion panel according to claim 1, wherein, in the radiation conversion layer, a plurality of flat spherical parts forming the helical structure are stacked obliquely with respect to a direction orthogonal to the substrate.

9. A radiation image conversion panel according to claim 8, wherein the flat spherical part connected to the columnar structure in the flat spherical parts is not greater than the column diameter of the columnar structure.

10. A radiation image conversion panel according to claim 1, wherein the radiation conversion layer is constituted by a scintillator containing CsI.

11. A radiation image conversion panel according to claim 1, wherein the radiation conversion layer is constituted by a photostimulable phosphor containing CsBr.

12. A radiation image conversion panel according to claim 1, wherein the substrate is made of a material containing a carbon fiber.

13. A method for producing a radiation image conversion panel having a radiation conversion layer, formed on a substrate, for converting an incident radiation into light;
   the method comprising vapor-depositing a vapor deposition source to become the radiation conversion layer onto the substrate while rotating a mount table mounting the substrate and an aperture for evaporating therethrough the vapor deposition source from a vapor deposition container accommodating the vapor deposition source about an axis of rotation extending in a direction intersecting the substrate with such a rotational speed difference that the aperture moves relatively slower than the substrate, so as to form, on a side opposite from a light exit surface for emitting the light in the radiation conversion layer, a reflective layer for reflecting the light to the exit surface side.

14. A method for producing a radiation image conversion panel according to claim 13, wherein, when constructing the radiation conversion layer by a plurality of columnar crystals in which the phosphor crystals are continuously stacked like columns, the method comprises the steps of:
   vapor-depositing the vapor deposition source onto the substrate while rotating the aperture at a first rotational speed, so as to form a helical structure comprising helically stacked phosphor crystals as the reflective layer, and
   vapor-depositing the vapor deposition source onto the substrate while rotating the aperture at a second rotational speed slower than the first rotational speed, so as to form a columnar structure extending from the helical structure to the light exit surface side along a direction intersecting the substrate integrally with the helical structure.

15. A method for producing a radiation image conversion panel according to claim 13, wherein, when constructing the radiation conversion layer by a plurality of columnar crystals in which the phosphor crystals are continuously stacked like columns, the method comprises the steps of:
   vapor-depositing the vapor deposition source onto the substrate while rotating the substrate at a first rotational speed, so as to form a helical structure comprising helically stacked phosphor crystals as the reflective layer; and
   vapor-depositing the vapor deposition source onto the substrate while rotating the substrate at a second rotational speed faster than the first rotational speed, so as to form a columnar structure extending from the helical structure to the light exit surface side along a direction intersecting the substrate integrally with the helical structure.

* * * * *

UNITED STATES PATENT AND TRADEMARK OFFICE
CERTIFICATE OF CORRECTION

PATENT NO.        : 8,637,830 B2
APPLICATION NO. : 13/255715
DATED             : January 28, 2014
INVENTOR(S)       : Yamashita et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 271 days.

Signed and Sealed this

Twenty-second Day of September, 2015

Michelle K. Lee
*Director of the United States Patent and Trademark Office*